United States Patent
Koukkari

(10) Patent No.: US 6,429,746 B1
(45) Date of Patent: Aug. 6, 2002

(54) SYSTEM AND METHOD FOR AUTO-BIAS OF AN AMPLIFIER

(75) Inventor: Eero Koukkari, Oulu (FI)

(73) Assignee: Nokia Networks OY, Espoo (FI)

( * ) Notice: Subject to any disclaimer, the term of this patent is extended or adjusted under 35 U.S.C. 154(b) by 0 days.

(21) Appl. No.: 09/455,939

(22) Filed: Dec. 7, 1999

(51) Int. Cl.$^7$ ................................................. H03F 3/04
(52) U.S. Cl. ...................................... 330/296; 330/285
(58) Field of Search ................................ 330/140, 141, 330/281, 285, 296

(56) References Cited

U.S. PATENT DOCUMENTS

| | | | | |
|---|---|---|---|---|
| 3,984,783 A | * | 10/1976 | Bickley | 330/296 |
| 4,458,213 A | | 7/1984 | Quan | 330/296 |
| 4,864,251 A | * | 9/1989 | Baur | 330/285 |
| 5,406,225 A | * | 4/1995 | Iida et al. | 330/296 |
| 5,422,522 A | * | 6/1995 | Rotay | 330/296 |
| 5,422,598 A | * | 6/1995 | Maeda et al. | 330/285 |
| 5,990,746 A | * | 11/1999 | Samuels | 330/285 |
| 6,052,032 A | * | 4/2000 | Jarvinen | 330/296 |
| 6,069,528 A | * | 5/2000 | Kashima | 330/140 |
| 6,091,302 A | * | 7/2000 | Arevalo | 330/296 |
| 6,111,466 A | * | 8/2000 | Mokhtar et al. | 330/296 |

FOREIGN PATENT DOCUMENTS

EP    0 601 410 A    6/1994

OTHER PUBLICATIONS

V. Meghdadi, et al: "Modeling of solid state power amplifiers (SSPA) and validation by means of a system simulator" Annales Des Telecommunications, vol. 53, No. 1/02, 1998, pp. 4–13.

Korzekwa: "Audio–Frequency Amplifiers" Electronics Engineers' Handbook, McGraw–Hill Book Company, 1989, Third Edition, pp. 13–21—13–24.

Mouly and Pautet: "The GSM System—The Radio Interface" Book, International Standard Book No. 2–9507190–0–7, 1992, pp. 232–235.

* cited by examiner

*Primary Examiner*—Robert Pascal
*Assistant Examiner*—Khanh Van Nguyen
(74) *Attorney, Agent, or Firm*—Banner & Witcoff, Ltd.

(57) ABSTRACT

The present invention provides a method and apparatus for auto-biasing an amplifier. The invention is particularly useful in biasing non-linear amplifiers and amplifiers whose input signal may be amplitude modulated (AM). The auto-bias system of the present invention has an active bias feedback loop that continuously adjusts the bias condition of an amplifier to a wanted state during amplifier operation by monitoring a physical quantity indicative of the operating state of the amplifier and controlling the amplifier bias so as to control the amplifier operating point sufficiently to compensate for variations in amplifier electrical characteristics, amplifier load, amplifier temperature, and input signals. In the case of an AM input signal, the auto-bias system of the present invention may provide sample and hold function so that the amplifier bias is the same during high power periods and low power periods, even though during high power periods the amplifier may be operating in a non-linear region. In one variation of the invention the amplifier may be an RF transistor, for example, a bipolar transistor, and may be used in a mobile cellular communications system. Further, the present amplifier auto-bias system eliminates the need for manually setting the amplifier bias during production and enables use of any transistor type in the amplifier.

16 Claims, 4 Drawing Sheets

SYSTEM AND METHOD FOR AUTO-BIAS OF AN AMPLIFIER

BACKGROUND OF THE INVENTION

1. Technical Field of the Invention

The present invention relates generally to electrical amplification, and more particularly to an auto-bias system and method for an amplifier.

2. Description of the Related Art

Mobile cellular communications, like many other electronic applications, requires a bias circuit to bias an amplifier which is used, for example, in the transmitter of a cellular base station or mobile telephone. In one conventional RF amplifier using a bipolar transistor, the general bias method for the RF amplifier has been to set a fixed DC-voltage to the base of the transistor. The collector current of the RF transistor is controlled by way of adjusting the DC-voltage during the production process in manufacturing the device using, for example, a variable resistor and diode. Once the bias is adjusted and set in production the bias of the amplifier remains substantially the same unless manually altered in the filed. One such circuit is shown in FIG. 1.

In the conventional amplifier shown in FIG. 1, the base voltage of an RF transistor is set by transferring the knee voltage of the diode D1 to the base of the bipolar transistor Q1 via the coil L2. The base voltage of transistor Q1 is adjusted by varying the resistance of variable resistor VR1 so as to control the bias current of the diode. Once the bias voltage is set during production of the circuit by adjusting the variable resistor VR1, it generally is not changed again even though the component characteristics will change over time. In the conventional bias method the power provided by $V_{CC}$ to the RF transistor Q1 via coil L1 and to the bias circuit series variable resistor VR1 and diode D1 are provided by separate paths and generally operate independently such that changes in the RF transistor Q1 operating characteristics due to, for example, changes in the RF transistor Q1 operating temperature, does not track the changes in the bias voltage provided by the series variable resistor VR1 and diode D1. Thus, the bias voltage provided to the base of the RF transistor does not track the electrical characteristic changes of the RF transistor Q1 and the bias voltage does not provide a sufficiently stable operating point for the RF transistor in all circumstances.

Further, the conventional bias method illustrated in FIG. 1 has the following problems and/or disadvantages. First, the bias circuit needs tuning during production which takes time and increases the risk of error in setting the correct bias voltage supplied to the base of RF transistor Q1. Second, the conventional circuit has some inherent temperature stabilization because D1 and Q1 have almost the same, but not exactly the same temperature characteristics. Thus the conventional circuit often needs an extra temperature compensation circuit added to provide the necessary variation in the bias voltage so as to stabilize the amplifier operation as required by some applications. For example, one such temperature compensation circuit is provided by adding a positive temperature coefficient (PTC) resistor connected in series with VR1. This causes the total resistance from Vcc to D1 to increase when the temperature rises, thus decreasing the base voltage of Q1 and collector current of Q1. However, even with the addition of such a temperature compensation circuit the conventional method of biasing results in a bias condition that tends to drift as a function of temperature, because the temperature compensation circuit is not exactly at the same temperature as the RF transistor Q1 at various times during circuit operation given that the RF transistor Q1 and the temperature compensation circuit are in different physical locations. Third, the thermal matching of the transistor Q1 and diode D1 pair has unit to unit variation so even though the transistor Q1 and diode D1 pair are matched as best as possible at their nominal values, the use of a particular transistor for transistor Q1 and a particular diode for diode D1 does not generally result in perfect thermal matching. Fourth, in high power conditions the RF transistor Q1 is at higher temperature than the diode D1 and causes more inaccuracy to the thermal compensation (i.e., power related temperature transients). Finally, the conventional bias method requires that during the design phase every different transistor type (e.g., transistors having different electrical and temperature characteristics) that is to be used as the transistor Q1 in the amplifier requires a different individual thermal compensation design so as to provide a design that is properly temperature compensated. Different transistor types occur, for example, when the RF transistor Q1 will be provided by more than one manufacturer and there is manufacturer-to-manufacturer variation or when a different style of transistor is going to be used, e.g., bipolar, MOSFET, LDMOS, or GASFET.

SUMMARY OF THE INVENTION

The present invention overcomes many of the foregoing problems and/or disadvantages by providing a method and apparatus for auto-biasing an amplifier. The invention is particularly useful in biasing non-linear amplifiers and amplifiers whose input signal are amplitude modulated (AM) or includes sufficient amplitude variations. The auto-bias system of the present invention has an active bias feedback loop that continuously adjusts the bias condition of an amplifier to a wanted state during amplifier operation by monitoring the operating state of the amplifier and controlling the amplifier bias so as to control the amplifier operating point sufficiently to compensate for variations in amplifier electrical characteristics, amplifier load, amplifier temperature, and input signals. In the case of an amplitude varying input signal, the auto-bias system of the present invention provides a sample and hold function so that the amplifier bias is the same during high power periods and low power periods, even though during high power periods the amplifier may be operating in a non-linear region. Further, the present amplifier auto-bias system eliminates the need for manually adjusting the amplifier bias during production and enables use of any transistor type in the amplifier.

According to one variation of the invention, an active bias feedback loop is provide which includes a bias measurement device connected to an amplifier transistor so as to measure a physical quantity, for example, a voltage, current, temperature etc. The measured physical quantity is provided to a control circuit which monitors the physical quantity and continuously adjusts its output according to variations in the physical quantity. The output of the control circuit (alternatively the output of the measurement device) is input to a sample and hold device, e.g., a capacitor, and to the bias circuit so as to vary the amplifier bias in a manner that will provide a relatively stable amplifier operating point in response to variation in the physical quantity being measured. Thus, the bias method of the present invention continuously adjusts the amplifier bias so as to improve the amplifier characteristics by maintaining a desired amplifier operating level.

According to another variation of the invention, a bias measurement is provided by measuring a current provided to an input terminal (e.g., collector) of an amplifier RF transistor. Measurement and control circuits includes a parallel set of series resistors, which act as voltage dividers, and a sample amplifier, which in conjunction operate to provide a varying voltage to a sample and hold capacitor based on a measured transistor input voltage. The sample and hold capacitor is connected to the input of an amplifier (e.g., a unity amplifier) which provides the desired bias voltage to the control terminal of the RF transistor. In operation, the sample and hold capacitor is charged to the desired RF transistor bias voltage by the output of the measurement and control circuits during the class-A (low power) operation as a function of, for example, the input voltage to the transistor terminal biased by $V_{CC}$, and maintains that bias voltage during the class-AB (high power) operation of the amplifier.

According to an even further variation of the invention, the pair of series resistors and the sample amplifier are replaced with a sampling transistor biased with a reference voltage, which acts as the measurement and control circuit. In operation, the sample and hold capacitor is charged to the desired RF transistor bias voltage by the output of the sampling transistor during the class-A (low power) operation as a function of, for example, the input current to the transistor terminal biased by $V_{CC}$, and maintains that bias voltage during the class-AB (high power) operation of the amplifier.

The invention is particularly useful for setting an amplifier bias in general because the bias control is automated and generally more accurate over time and temperature. Generally, the bias method of the present invention improves the amplifier characteristics, for example, current, temperature compensation, frequency response, and power. The invention provides various particular advantages which includes: (1) enabling the use of any type of transistor in the amplifier and eliminating the need for separate bias circuit design for various particular transistor types or transistors from different manufacturers; (2) eliminating the need to tune the amplifier in production because it is automatically tuned based on the design of the auto-bias system; (3) eliminating the need for providing an automatic temperature compensation feature because such compensation is inherent in the auto-biasing system of the present invention; and (4) eliminating the long term drift effects of bias parameters as well as a lag in the bias tracking that may result due to rapid amplifier loading.

The invention is also particularly useful for RF amplifiers and for biasing amplifiers that must operate both in linear and non-linear regions. As a result of using the auto-bias invention, the same desired transistor bias may be provided during both class-A operation and class-AB operation of the amplifier when using an AM or amplitude varying input signal.

BRIEF DESCRIPTION OF THE DRAWINGS

The foregoing summary of the invention, as well as the following detailed description of preferred embodiments, is better understood when read in conjunction with the accompanying drawings, which are included by way of example, and not by way of limitation, with regard to the claimed invention.

DESCRIPTION OF THE PREFERRED EMBODIMENTS

The auto-bias system of the present invention includes an active bias feedback loop that continuously adjusts the bias condition of an amplifier to a wanted state during amplifier operation. The active bias feedback loop monitors a bias measurement of a physical quantity indicative of the operating state of the amplifier and continuously adjusts the amplifier bias so as to control the amplifier operating point to compensate for variations in amplifier electrical characteristics, amplifier load, amplifier temperature, and input signals. As a result, the bias method of the present invention improves the overall amplifier electrical characteristics.

Figure 1:
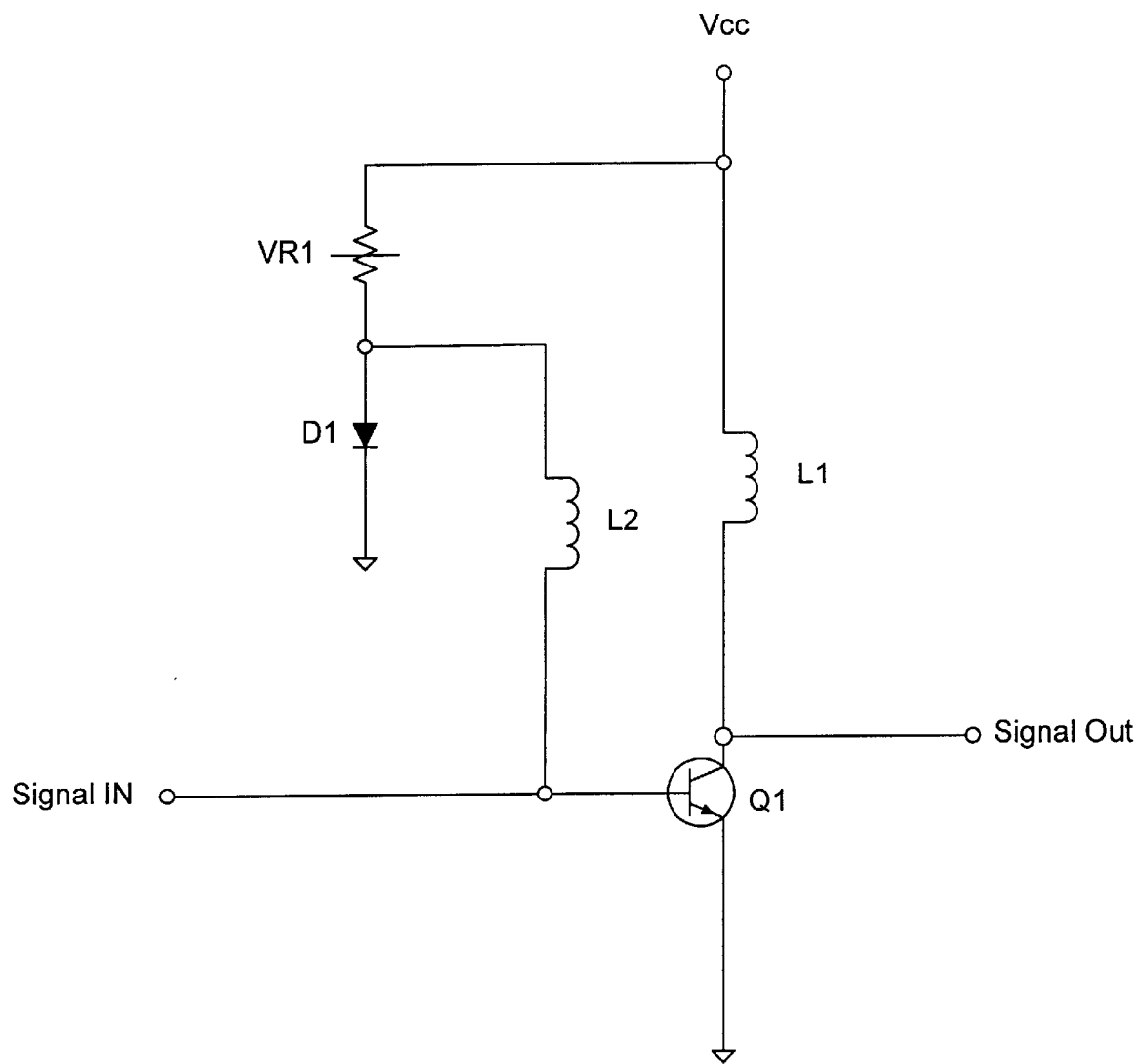
FIG. 1 illustrates a conventional RF amplifier bias circuit.
Figure 2:
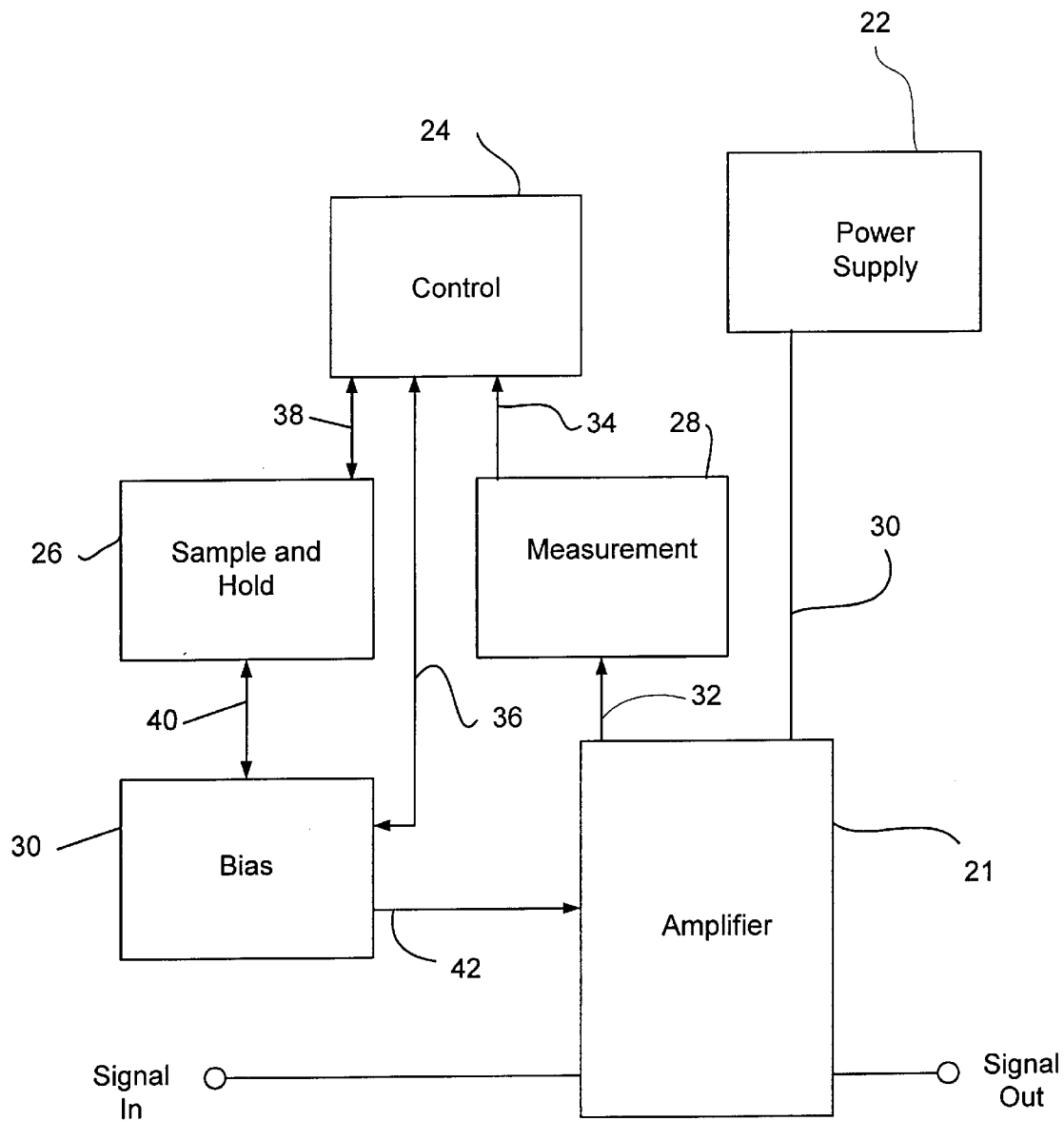
FIG. 2 illustrates a first embodiment of an auto-bias amplifier system, according to the invention.

A first preferred embodiment of the invention is illustrated in FIG. 2. The active bias feedback loop of the present invention is coupled to an amplifier 21 and includes in general a measurement device and an active bias device. More particularly, the active bias feedback loop may include, for example, a measurement device 28, a control device 24, a sample and hold device 26, and a bias device 30. The amplifier 21 is biased by a power supply 22. The measurement device 28 is coupled to the amplifier 21 and to the control device 24 and may be coupled to power supply 22. The control device 24 may be further coupled to the sample and hold device 26 and may be coupled to the bias device 30. The sample and hold device 26 is further coupled to the bias device 30. In its simplest form, the invention may include a measurement circuit and an active bias circuit that may include a sample and hold device.

In operation, the measurement device 28 measures a physical quantity, for example, an operating parameter such as a voltage, current, temperature etc., which is useful in controlling amplifier operation via the active bias feedback loop. The measurement provided by the measurement device 28 is, for example, a bias measurement, and is monitored by control 24. Control device 24 continuously adjusts its output in response to variations in the monitored measurement so as to maintain a particular desired bias level to the amplifier 21 via the sample and hold device 26 and the bias device 30. As such, any variation in the measured value will translate into a desired variation of the amplifier bias so that the amplifier maintains an optimum operating point that provides optimum amplifier electrical characteristics based on particular levels of current, temperature, power, etc., experienced by the amplifier during operation. As a note, the arrows illustrated in FIG. 2 are provided for ease of understanding and are not intended to limit the invention. One skilled in the art understands that the active bias feedback loop of the present invention may be constructed in such a manner as signals are provided between the various elements in manners different than those illustrated. For example, the sample and hold device may be between the measurement device and control device.

The invention is particularly useful for an amplifier used with an amplitude varying input signal with sufficient modulation during some time periods, e.g., a low power period, so that the amplifier is in class-A (linear) operation. In such an application, during the class-A operation the sample and hold device 26 will adjust so as to provide the desired amplifier bias during the class-AB (non-linear) operation periods, e.g., high power periods. One example of such an amplitude varying signal is an AM-type signal application using an amplifier in the transmitter of a Global System for Mobile Communications (GSM) system or, for example, Code Division Multiple Access (CDMA) signaling.

Although the following description of additional preferred embodiments will be described below with respect to the GSM system point of view for ease of understanding, one skilled in the art understands that the present invention is generally applicable to amplifier designs and applications.

Figure 3:
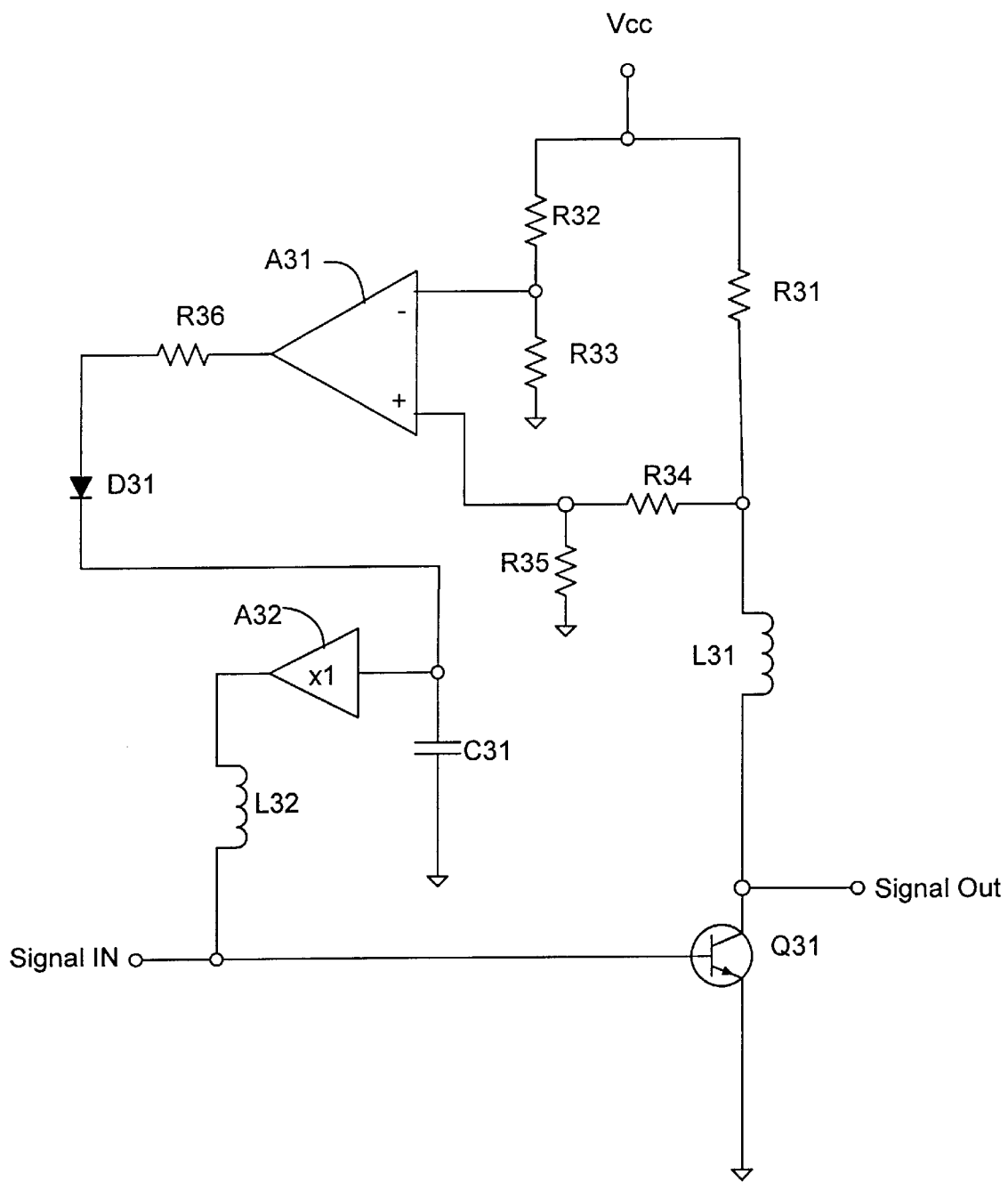
FIG. 3 illustrates a second embodiment of an auto-bias amplifier system, according to the invention.

Referring now to FIG. 3, a second preferred embodiment of the present invention is illustrated including an amplifier with an auto-bias active bias feedback loop. A transistor Q31 is a bipolar transistor and is coupled at its emitter to a ground, at its collector to a coil L31, and its base to a coil L32. An input signal to be amplified, Signal IN, is coupled to the base of transistor Q31 and the output signal of the amplifier is coupled to the collector of the transistor Q31. In GSM applications transistor Q31 may be an RF transistor and more particularly may be a bipolar transistor, a MOSFET, LDMOS, or GASFET, etc.

Resistors R31 . . . R35 and amplifier A31 form a differential amplifier circuit for measuring the collector current of Q1. A power supply $V_{CC}$ is coupled to transistor Q31 through resistor R31 and coil L31. Two voltage divider circuits are provided in parallel and are coupled between $V_{CC}$ and ground. Series resistors R32 and R33 are coupled to $V_{CC}$ and ground and an input of amplifier A31. Series resistors R34 and R35 are coupled to $V_{CC}$ (via R31) and ground and a different input of amplifier A31. Amplifier A31 may be, for example, an operational amplifier. A31 may also have a feedback resistor between its negative (−) and output terminals.

The output of amplifier A31 is coupled to resistor R36, which is coupled to diode D31. Diode D31 is coupled to one terminal of capacitor C31 and amplifier A32. Capacitor C31 is coupled at its second terminal to ground. The output of amplifier A32 is coupled to the base of transistor via coil L32. Amplifier A32 may be, for example, a unity amplifier, or any type of amplifier that will provide a desired amplifier bias voltage given a voltage stored in capacitor C31. As illustrated in this preferred embodiment the active auto-bias feedback loop includes resistors R31–R36, amplifiers A31 and A32, diode D31, and capacitor C31.

One skilled in the art will understand that particular values for the resistors and capacitor in the active auto-bias feedback loop are selected according to a particular application so as to achieve a desired nominal amplifier bias, for example, a transistor Q31 base voltage of 0.7 volts (typical transistor base voltage operating range is 0.6–1.0 volts). The values of the coils are also dependent on application and the amplifier characteristics. Some example values for the various circuit elements in the embodiment shown in FIG. 3 include Vcc=12V; L31=220 nH; L32=220 nH; R31=22 R; R32=330 R; R33=12 k; R34=1 k; R35=100 k; R36=1 k; and C31=10 uF. Although not illustrated in FIG. 3, the circuit may also contain, for example, a 1 Megaohm resistor in parallel with C31 to slowly discharge capacitor C31 or the input impedance of amplifier A32 might be used to slowly discharge the capacitor.

In a GSM system operation for example, the invention utilizes the time slot structure of the GSM system where consecutive time slots (high power periods) are separated with a low power period. During the low power periods the amplifier (e.g., transistor Q31) operates in class-A (linear) mode and during the high power periods the amplifier operates in class-AB (non-linear) mode. The transistor Q31 is biased to a desired condition using the active auto-bias feedback loop of the present invention. The embodiment of FIG. 3 monitors the collector current to the transistor Q31 via the voltage across resistor R31 and continuously drives a DC voltage to the base of the transistor Q31 during class-A operation so as to achieve a desired collector current for transistor Q31. If the collector current is too low the voltage of the positive (+) input to amplifier A31 is high relative to the voltage of the negative (−) input to amplifier A31 and causes the output voltage of amplifier A31 to increase, thus causing the voltage of capacitor C31 and the bias of the base of transistor A31 to increase. The base voltage of transistor Q31 will increase and provide a corresponding increase in the collector current. The increased collector current causes the positive (+) input of amplifier A31 to reach the voltage of the negative (−) input. When a balanced condition is reached, for example during the class-A operation, a voltage that will provide the desired amplifier bias voltage to the base of transistor Q31 is stored in capacitor C31. Thus, the voltage of the capacitor C31 when using, for example, an unity amplifier for amplifier A32, equals the base voltage of the amplifier transistor Q31 during a period when little or no input signal amplitude is provided as Signal IN (e.g., low power period).

The capacitor C31 provides a sample and hold function in GSM operation so that the voltage stored in capacitor C31 when there is little or no input signal (e.g., lower power period) is used to hold the transistor base voltage at the desired transistor base bias voltage during the signal period (e.g., high power period). At the end of the low power period the base voltage of the transistor Q31 corresponds to the voltage of the desired collector bias current. During the high power signal period the amplifier transistor Q31 operates in a non-linear manner (class-AB non-linear operation) and the active auto-bias feedback cannot be used for controlling the bias state. Rather, during the active signal period the voltage stored (sample and hold voltage) in the capacitor C31 powers the input terminal of amplifier A32 which provides a desired base voltage to transistor Q31. Thus, when an active input signal is provided as Signal IN (e.g., high power period) the amplifier bias voltage (e.g., the base voltage of transistor Q31) corresponds to substantially the amplifier bias voltage provided when there is little or no input signal provided as Signal IN (e.g., low power period). During a subsequent little or no input signal period the bias voltage is again controlled for the next active input signal period.

Figure 4:
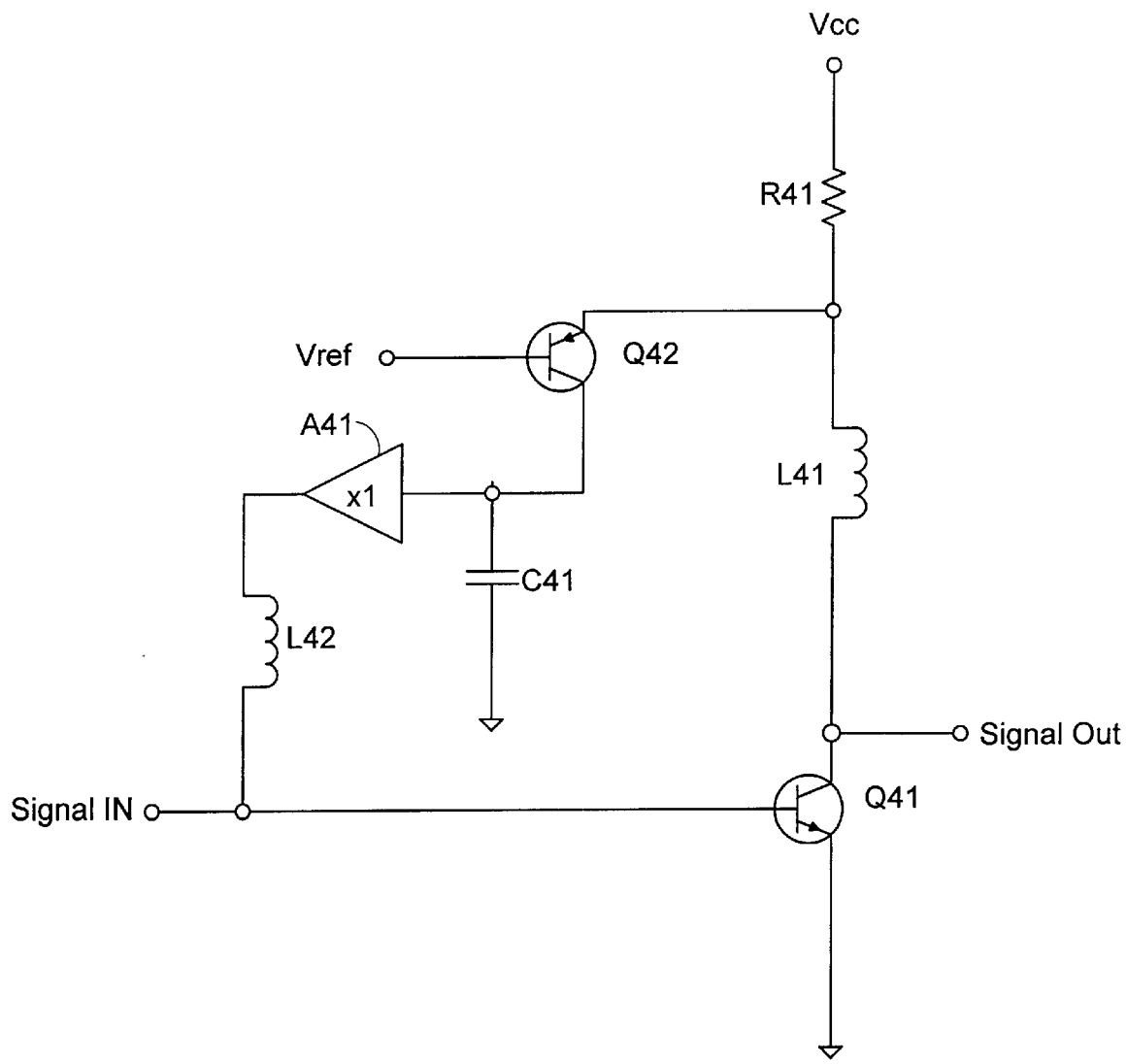
FIG. 4 illustrates a third embodiment of an auto-bias amplifier system, according to the invention.

FIG. 4 illustrates a further preferred embodiment of the present invention with fewer circuit elements for the auto-bias active bias feedback loop. An amplifier including transistor Q41, an NPN bipolar transistor, is coupled at its emitter to a ground, at its collector to a coil L41, and its base to a coil L42. An input signal to be amplified, Signal IN, is coupled to the base of transistor Q41 and an output signal of the amplifier is coupled to the collector of the transistor Q41. In a GSM application transistor Q41 may be an RF transistor and more particularly may be a bipolar transistor, MOSFET, LDMOS, or GASFET, etc.

A power supply $V_{CC}$ is coupled to transistor Q41 through resistor R41 and coil L41. A transistor Q42, for example a PNP bipolar transistor, is coupled at its emitter between resistor R41 and coil L41. A reference voltage Vref is coupled to the base of transistor Q42. The collector of transistor Q42 is coupled to one terminal of a capacitor C41 and the input of an amplifier A41. Capacitor C41 is coupled at a second terminal to ground. The output of amplifier A41 is coupled to the base of transistor Q41 via coil L42. Amplifier A41 may be, for example, a unity amplifier, or any type of amplifier that will provide a desired amplifier bias voltage given a voltage stored in capacitor C41. As illustrated in this preferred embodiment the active auto-bias feedback loop includes transistor Q42, capacitor C41, and amplifier A41.

In operation, if the collector current of transistor Q41 is too low the emitter voltage of transistor Q42 is high relative to the reference voltage Vref which causes the collector voltage of transistor Q42 to increase. The increase in voltage of the collector voltage of transistor Q42 results in increased output voltage from amplifier A41, i.e., the base voltage of transistor Q41 increases, until a corresponding increase in the collector current of transistor Q41 causes the emitter voltage of transistor Q42 to reach a balance condition (e.g., Vref+0.7volts). When a balance condition is reached during, for example, a period of little or no input signal to Signal In, (e.g., the class-A operation) and the desired amplifier bias voltage is provided to the base of transistor Q41, capacitor C41 will store the voltage indicative of the desired amplifier bias voltage. For example, when a unity amplifier is used for amplifier A41, the voltage of capacitor C41 (sample and hold capacitor) will equal the bias voltage of the amplifier, i.e., the base voltage of transistor Q41. The amplifier bias provided in the little or no signal power period (class-A) is used during the following high power period (class-AB) as a result of the voltage stored in capacitor C41 so that the desired amplifier bias is sufficiently maintained throughout low power and high signal power periods.

Once again, one skilled in the art will understand that particular values for the resistor and capacitor in the active auto-bias feedback loop of FIG. 4 are selected according to a particular application so as to achieve a desired nominal amplifier bias, for example, a transistor Q41 base voltage of 0.7 volts (typical transistor base voltage operating range is 0.6–1.0 volts). The values of the coils are also dependent on application and the amplifier characteristics. Some example values for the various circuit elements in the embodiment shown in FIG. 4 include: Vcc=12V; L41=220 nH; L42=220 nH; R41=22 R; C41=10 uF; and Vref=11V. Although not illustrated in FIG. 4, the circuit may also contain, for example, a 1 Megaohm resistor in parallel with C41 to slowly discharge capacitor C41 or the input impedance of amplifier A41 might be used to slowly discharge the capacitor.

Even though the invention is described above using a GSM system example, one skilled in the art will understand that the invention is very useful for any amplifier with sufficient AM-modulation or amplitude variation causing class-A operation for a period of time. For example, the active auto-bias feedback system of the present invention can be used for e.g. CDMA systems because the invention includes a sample and hold operation during the class-A period (e.g., low power) of an input signal to maintain the desired bias during a class-AB period (e.g., high power) of an input signal. The invention is well suited for applications in which the input signal has sufficient amplitude variation so that the sample and hold capacitor can store the desired amplifier bias during low signal periods and maintain the same relative bias level during high signal periods. Further, the invention may be used for any amplifier design regardless of the type of transistor used.

The invention is particularly useful for setting a amplifier bias in general because the bias control is automated and generally more accurate over time and temperature. Generally, the bias method of the present invention improves the amplifier characteristics, for example, current, temperature compensation, frequency response, and power. The invention is also particularly useful for RF amplifiers and even more useful for biasing amplifiers that must operate in both linear and non-linear regions. As a result of using the auto-bias invention, the same desired amplifier bias may be provided during both class-A operation and class-AB operation of the amplifier when using an AM or amplitude varying input signal. This is particular useful when the amplifier experiences rapid increased loading that results in a significant temperature change on an initial signal input after an inactive period. For example, the present invention when used in a transmitter of a base station in a cellular communication system allows the amplifier bias to adjust rapidly to changes in the loading condition of the amplifier when the base station experiences a rapid increase in signaling traffic after being idle for a long period of time (e.g., in the morning when cellular phone users start using their phones after little use at night).

Although particular embodiments of the present invention have been shown and described, it will be understood that they are not intended to limit the invention to the preferred embodiments and it will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims.

For example, the present invention may be implemented using either analogue or digital techniques, or both. Likewise the present invention may be implemented using discrete components or integrated circuits, or both. Furthermore, the type of transistors used in the invention may of any type and any conductivity, i.e., bipolar, MOS, NPN, PNP, etc. Finally, although the invention is particularly useful for RF amplifiers including a power transistor, the present invention may be used to bias any type of amplifier.

What is claimed is:

1. An apparatus comprising:
   a first amplifier; and
   a feedback circuit coupled to said first amplifier that adjusts a bias level of said first amplifier, wherein said feedback circuit samples a peak voltage during a low power mode and holds said peak voltage during a high power mode so as to sufficiently maintain said bias level as set according to an operating parameter.

2. The apparatus as claimed in claim 1, wherein said feedback circuit further includes a control circuit to control said adjustment of said bias level.

3. An apparatus comprising:
   a first amplifier; and
   a feedback circuit coupled to said first amplifier that adjusts a bias level of said first amplifier, said feedback circuit including a control circuit to control said adjustment of said bias level and a bias circuit to drive an input of said first amplifier,
   wherein said feedback circuit samples a peak voltage during a low power mode and holds said peak voltage during a high power mode so as to sufficiently maintain said bias level.

4. The apparatus as claimed in claim 3, wherein said feedback circuit further includes a measurement circuit for measuring a physical quantity related to operation of said first amplifier.

5. The apparatus as claimed in claim 4, wherein said feedback circuit includes a diode connected in series with a capacitor.

6. The apparatus claimed in claim 5, wherein said control circuit includes a second amplifier having an input coupled to said capacitor of said feedback circuit and an output coupled to said first amplifier.

7. The apparatus as claimed in claim 4, wherein said bias circuit includes second amplifier.

8. The apparatus as claimed in claim 6, wherein said first amplifier is an RF amplifier.

9. An apparatus comprising:

an amplifier; and an auto-bias circuit biasing an input of said amplifier so that said input of said amplifier is continuously adjusted in at least one mode based on variations in an operating parameter of said amplifier, said auto-bias circuit sampling a peak voltage during a low power mode and holding said peak voltage during a high power mode so as to sufficiently maintain said input at a bias as set according to said operating parameter.

10. The apparatus as claimed in claim 9, wherein said auto-bias circuit includes:

a measuring circuit measuring a physical quantity of said amplifier;

a monitoring circuit monitoring said measured physical quantity and controlling said input of said amplifier; and said auto-biasing circuit biasing said input of said amplifier based on said peak voltage.

11. The apparatus as claimed in claim 9, wherein said auto-bias circuit includes a diode connected in series with a capacitor.

12. In a wireless telecommunication system, a transmitter comprising an amplifier system, the amplifier system comprising:

a first transistor; and a feedback circuit coupled to said first transistor so as to bias an input of said first transistor so that said input of said first transistor is continuously adjusted in at least one mode based upon variations in an operating parameter of said first transistor, said feedback circuit including a diode and a capacitor that measures a peak voltage and holds said peak voltage to bias said input of said first transistor, wherein said feedback circuit measures the peak voltage during a low power mode and holds the peak voltage during a high power mode so as to sufficiently maintain said input at a bias as set according to said operating parameter.

13. The transmitter as claimed in claim 12, further comprising an amplifier coupled between said first transistor and said capacitor of said feedback circuit.

14. A method for biasing an amplifier, comprising the steps of:

measuring a peak value of an operating parameter of said amplifier so as to set said amplifier to a predetermined operating condition;

biasing said amplifier based on said peak value of said operating parameter so as to provide said predetermined amplifier operating condition regardless of a level of an input signal to said amplifier;

monitoring said operating parameter; and controlling a voltage input to an auto-bias circuit so as to set a desired amplifier bias in all modes of operation.

15. The method as claimed in claim 14, further including the step of:

detecting a peak voltage and holding said peak voltage so as to maintain said desired amplifier bias during a high power period.

16. The method as claimed in claim 15, wherein said auto-bias circuit includes a capacitor.

* * * * *